United States Patent
Jayanti et al.

(10) Patent No.: US 10,546,756 B2
(45) Date of Patent: Jan. 28, 2020

(54) METHOD FOR GENERATING VERTICAL PROFILES IN ORGANIC LAYER ETCHES

(71) Applicant: Lam Research Corporation, Fremont, CA (US)

(72) Inventors: Sriharsha Jayanti, Fremont, CA (US); Sangjun Cho, San Ramon, CA (US); Steven Chuang, San Francisco, CA (US); Hsu-Cheng Huang, Fremont, CA (US); Jian Wu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/805,857

(22) Filed: Nov. 7, 2017

(65) Prior Publication Data

US 2018/0151386 A1    May 31, 2018

Related U.S. Application Data

(60) Provisional application No. 62/427,408, filed on Nov. 29, 2016.

(51) Int. Cl.
| | |
|---|---|
| *H01L 21/311* | (2006.01) |
| *H01L 21/033* | (2006.01) |
| *H01L 21/027* | (2006.01) |
| *H01L 21/02* | (2006.01) |

(52) U.S. Cl.
CPC .... *H01L 21/31138* (2013.01); *H01L 21/0271* (2013.01); *H01L 21/02252* (2013.01); *H01L 21/0332* (2013.01); *H01L 21/31122* (2013.01); *H01L 21/31144* (2013.01); *H01L 21/0228* (2013.01); *H01L 21/02164* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 6,040,248 A | 3/2000 | Chen et al. | |
| 6,465,159 B1 | 10/2002 | Ni et al. | |
| 6,734,096 B2* | 5/2004 | Dalton | H01L 21/76811 |
| | | | 257/E21.579 |
| 6,897,159 B1* | 5/2005 | Lee | H01L 21/02063 |
| | | | 257/E21.252 |
| 6,936,539 B2* | 8/2005 | Yin | H01L 21/0276 |
| | | | 257/E21.018 |
| 6,962,879 B2* | 11/2005 | Zhu | H01L 21/31116 |
| | | | 257/E21.252 |
| 7,645,707 B2 | 1/2010 | Rusu et al. | |
| 8,133,819 B2 | 3/2012 | Wang et al. | |
| 8,501,627 B2 | 8/2013 | Chi et al. | |
| 9,324,569 B2* | 4/2016 | Ishii | H01L 21/3065 |
| 9,514,959 B2* | 12/2016 | Anderson | H01L 21/31116 |
| 2006/0172540 A1* | 8/2006 | Marks | H01L 21/0273 |
| | | | 438/700 |
| 2010/0081286 A1* | 4/2010 | Kim | H01L 21/31122 |
| | | | 438/710 |
| 2010/0327413 A1* | 12/2010 | Lee | H01L 21/31122 |
| | | | 257/618 |
| 2012/0276737 A1* | 11/2012 | Wang | H01L 21/02063 |
| | | | 438/653 |
| 2012/0289050 A1 | 11/2012 | Wu et al. | |
| 2014/0187050 A1* | 7/2014 | Posseme | H01L 21/3081 |
| | | | 438/717 |
| 2014/0213059 A1* | 7/2014 | Doan | H01L 21/31138 |
| | | | 438/694 |
| 2015/0004795 A1* | 1/2015 | Ishii | H01L 21/3065 |
| | | | 438/717 |
| 2015/0099367 A1* | 4/2015 | Kim | H01L 21/31116 |
| | | | 438/715 |
| 2015/0200109 A1* | 7/2015 | Kong | H01L 21/31144 |
| | | | 438/703 |
| 2016/0005602 A1* | 1/2016 | Yoo | H01L 21/0338 |
| | | | 216/41 |
| 2016/0111516 A1* | 4/2016 | Hong | H01L 29/7841 |
| | | | 257/347 |
| 2017/0125260 A1* | 5/2017 | Tan | H01J 37/32715 |

FOREIGN PATENT DOCUMENTS

JP    H07-263353    10/1995

OTHER PUBLICATIONS

International Search Report from International Application No. PCT/US2017/060449 dated Feb. 21, 2018.
Written Opinion from International Application No. PCT/US2017/060449 dated Feb. 21, 2018.
Kim et al. "Study on the etching characteristics of amorphous carbon layer in oxygen plasma with carbonyl sulfide", Journal of Vacuum Science and Technology, p. 021301-2-021301-7, 2013.

* cited by examiner

*Primary Examiner* — Allan W. Olsen
(74) *Attorney, Agent, or Firm* — Beyer Law Group LLP

(57)    ABSTRACT

A method for etching an organic carbon based layer below a silicon containing hardmask is provided. An etch gas is provided comprising oxygen and a halogen containing component, and a passivation component, wherein a ratio by volume of total flow rate of the etch gas to flow rate of the halogen containing component is between 10,000:1 to 10:1. The etch gas is formed into a plasma, wherein the organic carbon based layer and the silicon contain hardmask are exposed to the plasma and wherein the plasma selectively etches the organic carbon based layer with respect to the silicon containing hardmask.

19 Claims, 4 Drawing Sheets

US 10,546,756 B2

METHOD FOR GENERATING VERTICAL PROFILES IN ORGANIC LAYER ETCHES

CROSS REFERENCE TO RELATED APPLICATION

This application claims the benefit of priority of U.S. Provisional Application No. 62/427,408, filed Nov. 29, 2016, which is incorporated herein by reference for all purposes.

BACKGROUND

The disclosure relates to a method of forming semiconductor devices on a semiconductor wafer. More specifically, the disclosure relates to etching features in an organic layer below a silicon containing hardmask.

In forming semiconductor devices, etch layers may be etched to form features. In some processes an organic layer may be etched using a silicon containing hardmask. The patterned organic layer may be used as a mask for a subsequent etch of an underlying layer.

SUMMARY

To achieve the foregoing and in accordance with the purpose of the present disclosure, a method for etching an organic carbon based layer below a silicon containing hardmask is provided. An etch gas is provided comprising oxygen and a halogen containing component, and a passivation component, wherein a ratio by volume of total flow rate of the etch gas to flow rate of the halogen containing component is between 10,000:1 to 10:1. The etch gas is formed into a plasma, wherein the organic carbon based layer and the silicon contain hardmask are exposed to the plasma and wherein the plasma selectively etches the organic carbon based layer with respect to the silicon containing hardmask.

These and other features of the present disclosure will be described in more details below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
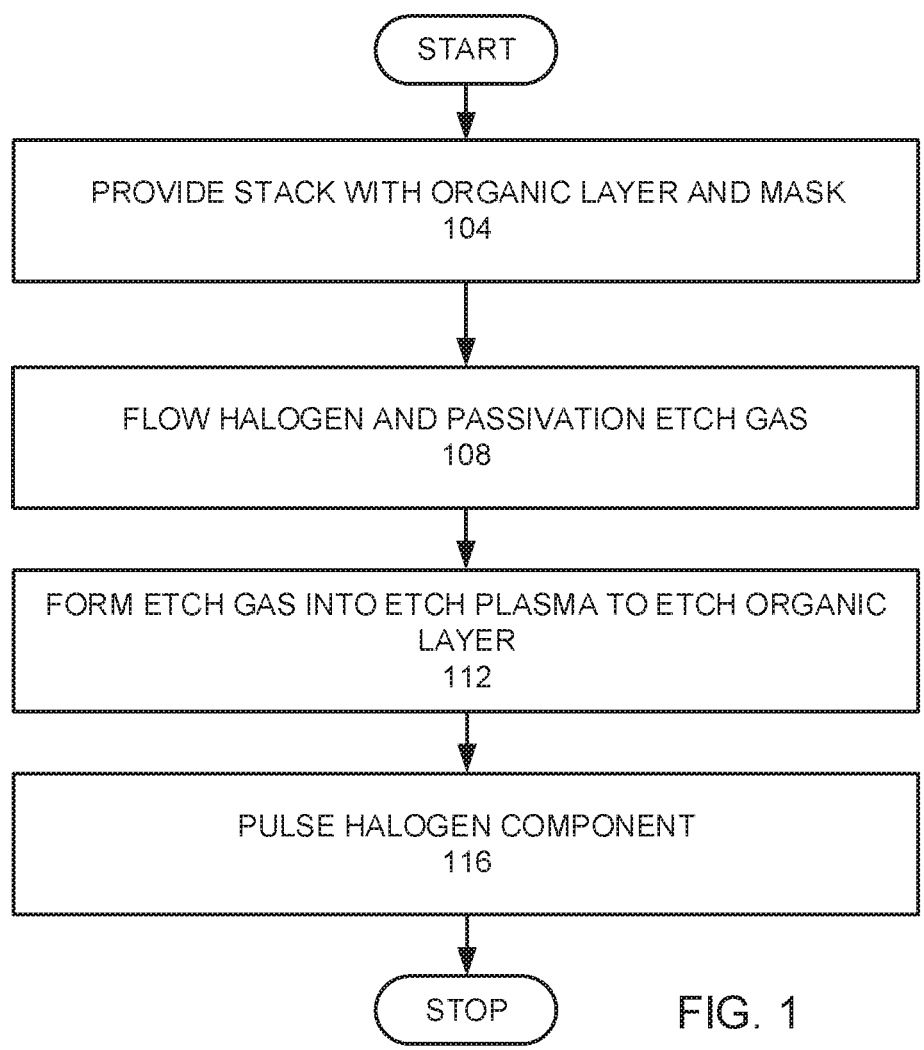
FIG. 1 is a high level flow chart of an embodiment.

FIG. 1 is a high level flow chart of an embodiment. In this embodiment, a stack is provided, where the stack has an organic carbon based layer and a silicon containing mask (step 104). An etch gas comprising oxygen, a halogen containing component, and a passivation component is provided (step 108). The etch gas is formed into a plasma which etches the organic carbon based layer through the silicon containing mask (step 112). The halogen containing component is pulsed (step 116).

Example

Figure 2A:
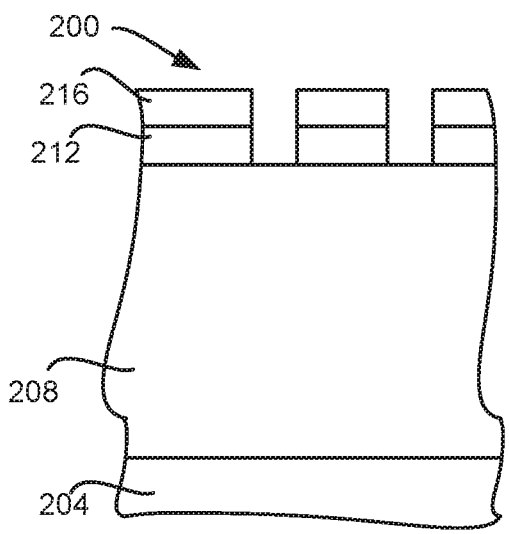
FIGS. 2A-B are schematic cross-sectional views of a stack processed according to an embodiment.

In a preferred embodiment, a stack is provided, where the stack has an organic carbon based layer and a silicon containing mask (step 104). FIG. 2A is a schematic cross-sectional view of a stack 200 with a substrate 204 under an organic carbon based layer 208 under a silicon containing mask. In this example, the silicon containing mask comprises a silicon mask 212 under a silicon oxide mask 216 deposited by atomic layer deposition. The organic carbon based layer 208 in this example is an amorphous carbon layer. One or more layers may be between the substrate 204 and the organic carbon based layer 208, and one or more layers may be between the organic carbon based layer 208 and the silicon containing mask. For example, an etch layer may be between the organic carbon based layer 208 and the substrate 204, where the etched organic carbon based layer 208 is subsequently used as a mask for etching the etch layer.

Figure 3:
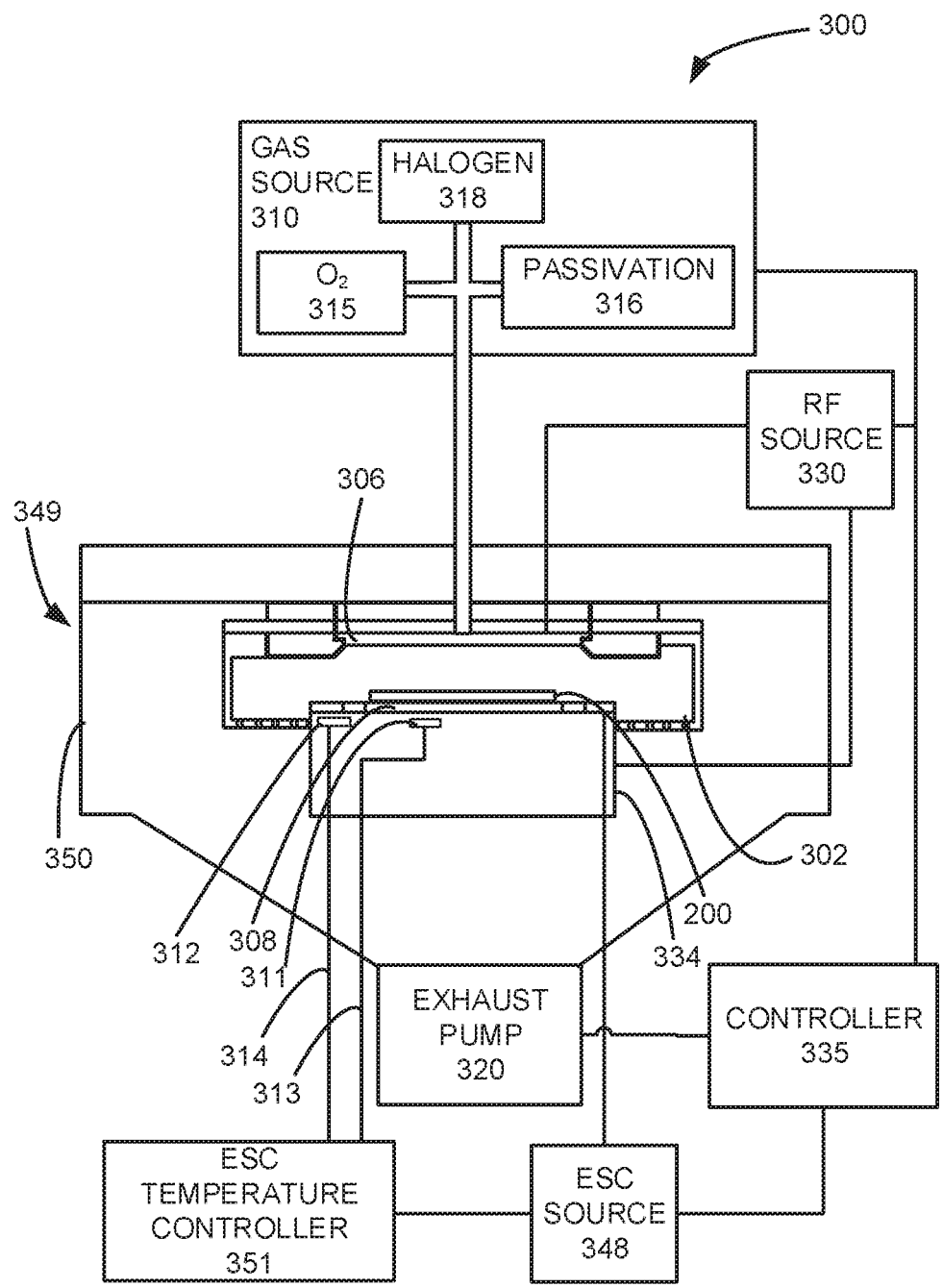
FIG. 3 is a schematic view of a plasma processing chamber that may be used in an embodiment.

The stack 200 may be placed in a plasma processing chamber to perform the etch. FIG. 3 is a schematic view of a plasma processing chamber that may be used in an embodiment. In one or more embodiments, the plasma processing chamber 300 comprises a gas distribution plate 306 providing a gas inlet and an electrostatic chuck (ESC) 308, within a processing chamber 349, enclosed by a chamber wall 350. Within the processing chamber 349, the stack 200 is positioned on top of the ESC 308. The ESC 308 may be provided with a bias from the ESC source 348. A gas source 310 is connected to the processing chamber 349 through the gas distribution plate 306. In this embodiment, the gas source 310 comprises an $O_2$ gas source 315, a passivation gas source 316, and a halogen component gas source 318. The gas source 310 may have additional gas sources. Each gas source may comprise multiple gas sources. An ESC temperature controller 351 is connected to the ESC 308, and provides temperature control of the ESC 308. In this example, a first connection 313 for providing power to an inner heater 311 for heating an inner zone of the ESC 308 and a second connection 314 for providing power to an outer heater 312 for heating an outer zone of the ESC 308. A radio frequency (RF) source 330 provides RF power to a lower electrode 334 and/or an upper electrode, which in this embodiment is the gas distribution plate 306. In a preferred embodiment, 2 MHz, 60 MHz, and optionally, 27 MHz power sources make up the RF source 330 and the ESC source 348. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments, such as in another embodiment the upper electrodes may be grounded. A controller 335 is controllably connected to the ESC temperature controller 351, the RF source 330, the ESC source 348, an exhaust pump 320, and the gas source 310. An example of such a etch chamber is the Exelan Flex™ etch system manufactured by Lam Research Corporation of Fremont, Calif. The process chamber can be a CCP (capacitive coupled plasma) reactor or an ICP (inductive coupled plasma) reactor. An ICP reactor may provide more bias control, which may provide an improved etch process.

Figure 4:
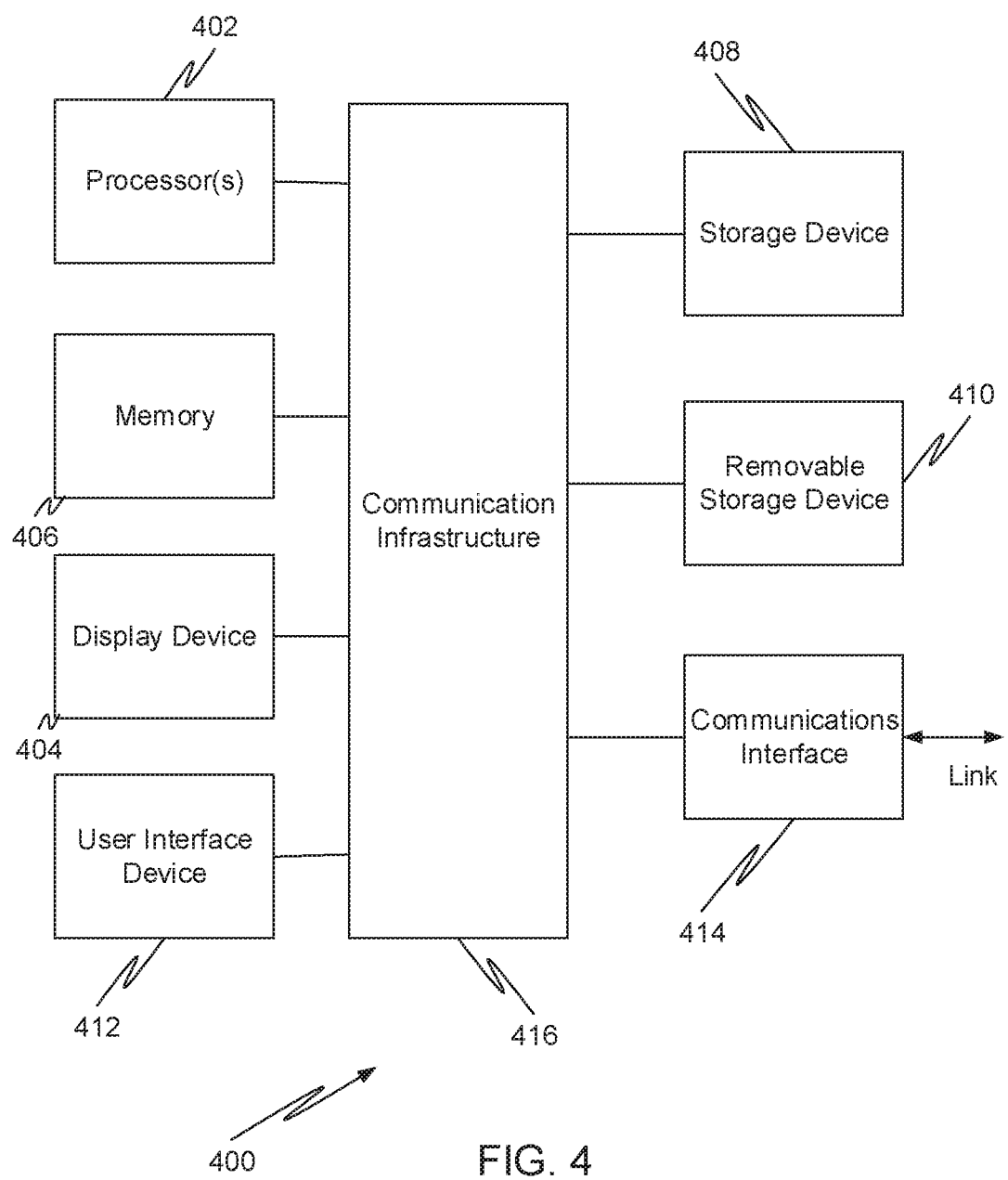
FIG. 4 is a schematic view of a computer system that may be used in practicing an embodiment.

FIG. 4 is a high level block diagram showing a computer system 400, which is suitable for implementing a controller 335 used in embodiments of the present disclosure. The computer system 400 may have many physical forms ranging from an integrated circuit, a printed circuit board, and a small handheld device, up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
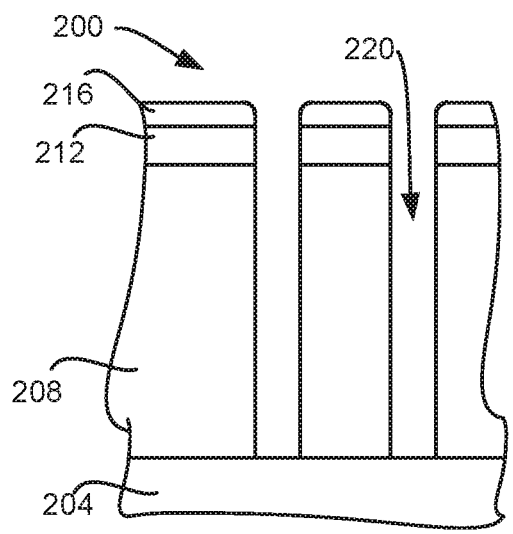

After the stack has been placed into the plasma processing chamber 300, an etch process is begun by providing a flow of an etch gas comprising oxygen, a halogen containing component, and a passivation component into the processing chamber 349 (step 108) In this example, the etch gas comprises 35 sccm $CH_4$, 21 sccm COS, 2 sccm $CH_3F$, 100 sccm $N_2$, and 100 sccm $O_2$. A pressure of 20 mTorr is provided. The etch gas is transformed into a plasma to etch the organic carbon based layer 208 (step 112). In this example, a RF pulsed with a 20% duty cycle between 500 Watts and 1090 Watts at 60 MHz is provided to transform the etch gas into a plasma. Pulsing the RF provides profile improvement. The high peak power is beneficial for opening up the bottom CD, but tradeoff is an increase in bowing. By pulsing between lower power and higher power, sufficient sidewall passivation is provided to prevent large bow CD while still enabling a larger bottom CD. The organic carbon based layer 208 is exposed to the in-situ plasma for 55 seconds. FIG. 2B is a schematic cross-sectional view of a stack 200 after the etch is completed. Features 220 have been etched into the organic carbon based layer 208. The features 220 have substantially vertical sidewalls.

In some embodiments, the halogen containing component may be pulsed (step 116). The pulsing of the halogen containing component may periodically stop the flow of the halogen containing component. In other embodiments, the pulsing of the halogen containing component may vary the flow rate of the halogen containing component.

In has been unexpectedly found that having a small amount of a halogen component in the etch gas is able to trim redeposited silicon to provide an improved vertical profile. Too much halogen will etch away the silicon based hardmask, which will cause irregular features. Preferably, a ratio of the total flow rate of the etch gas by volume (for example by ratio of flow in sccm) to the flow rate of halogen component by volume is between 10,000:1 to 10:1 by volume. More preferably, the ratio of the total flow rate of the etch gas to the flow rate of the halogen component is between 300:1 to 20:1. Experiments have found that a halogen component by volume of between 0.5% to 4% of the total etch gas may be used in an embodiment. Such embodiments have a ratio of the total flow rate of the etch gas to the flow rate of the halogen component is between 200:1 to 25:1. If the halogen containing component is pulsed, preferably, the average flow rate of the halogen containing component is within the preferred ratio range of the flow rate of the total etch gas to the flow rate of the halogen containing component.

In some embodiments the halogen component may use other halogen components instead of $CH_3F$. Some of the other halogen components may be $Cl_2$, $CH_2F_2$, or HBr. The halogen component must be of a concentration to slowly remove the redeposited Si, while minimizing Si-mask loss. Therefore the halogen content and flow rate are restricted to obtain the optimal bow profile versus minimizing Si-mask loss.

Preferably, low pressure is maintained to reduce lateral etching. Preferably, the low pressure is less than 40 mTorr. Without being bound by theory, it is believed that a higher pressure causes increased bowing due to increased Oxygen radicals. Higher pressure is expected to show increased tradeoff between increased bow and increased bottom CDs. In addition, higher pressure could degrade mask fidelity due to higher partial pressure of the halogen component or more isotropic etching of mask. Preferably, the passivation component is halogen free. In some embodiments the passivation component comprises COS and $CH_4$. In some embodiments, the passivation component comprises at least one of COS and $CH_4$. In some embodiments, the passivation component consists essentially of COS, $CH_4$, and $N_2$. Preferably, the silicon containing hardmask forms sub 30 nm features. More preferably, the silicon containing hardmask forms sub 20 nm features. Preferably, the features have an height to width aspect ratio of greater than 3:1. Some embodiments may be used for mask open. At sub 30 nm there is little room for mask distortion during the opening of the mask. Various embodiments are able to open the mask with less distortion than other processes providing a vertical profile without bowing. Such feature sizes and lack of distortion are useful in forming memory devices, such as dynamic random access memory (DRAM).

In other embodiments, the silicon containing hardmask may be Si, $SiO_2$, SiN, Si-ARC, SiON, or a silicon containing antireflective coating. In various embodiments, the silicon containing hardmask may be a mask used in a double patterning process.

Figure 5:
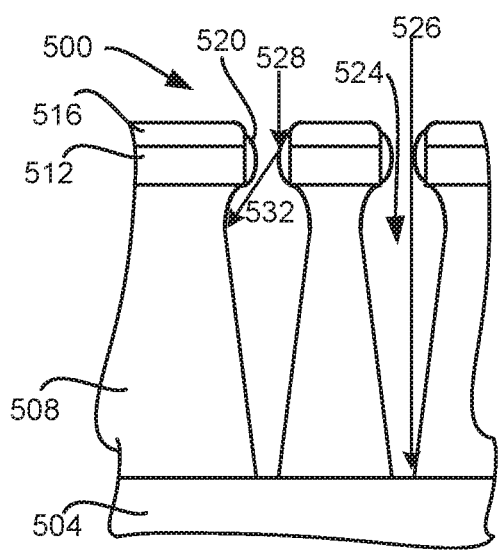
FIG. 5 is a schematic cross-sectional view of a stack processed according to the prior art.

FIG. 5 is a schematic cross-sectional view of a stack 500 that has been processed using a prior art process with a substrate 504 under an organic carbon based layer 508 under a silicon containing mask. In this example, the silicon containing mask comprises a silicon mask 512 under a silicon oxide mask 516 deposited by atomic layer deposition. The organic carbon based layer 508 in this example is an amorphous carbon layer. In this example of the prior art, an etch gas comprising oxygen, without a halogen component and without a passivation component is used in a single etch step. Ions from the etch gas cause silicon from the silicon containing mask to sputter and redeposit on sides of the silicon containing mask to form redeposited sidewalls 520. The redeposited sidewalls 520 narrow the width of the apertures, causing the bottoms of the features 524 to be tapered, since vertically directed ions 526 can only pass through a narrower gap, as shown. In addition, the redeposited sidewalls 520 are curved, which cause ions 528 to become deflected ions 532, which are directed into sidewalls of the features, causing sidewall blowout, as shown.

Another prior art process provided a cyclical process that provided a trim process in addition to the etch process in the above described prior art, where the trim and etch process were sequentially repeated a plurality of times. The trim process would etch away the redeposited sidewalls. It was found that such a cyclic process did not sufficiently prevent blow out or the tapering of the sidewalls.

The semiconductor industry strives to improve device performance by continually reducing device size and density. Reducing the vertical and lateral dimensions of a device limit the tolerance (or margins) on the etch profiles. At the sub 20 nm node traditional photolithography techniques are insufficient to create a mask for via etch. Instead, multiple patterning is necessary, where two layers of lines (typically Si-containing layers) are generated at an angle to form the mask pattern. The first objective is to transfer this pattern to the underlying organic layer.

As the device size shrinks, the hole sizes and the bar critical dimensions (CDs) shrink. Consequently, the maximum bowing that can be tolerated in the organic layer is reduced. A large bow could reduce the device yield due to hole merging, pattern fidelity degradation, local hole non-uniformity, and further limitations in the transfer of the organic mask pattern to an underlying layer.

The prior art etch performance limitations in bowing and bar CD growth can be narrowed down to three major contributions. First, as mentioned previously, the increasing device density places a limit on the minimum bar CD to sustain the pattern integrity; this also restricts the bow tolerance. Second, a chemistry imbalance can lead to highly isotropic or chemical based etching. For example, if there is too much chemical etchant, such as a high amount of $O_2$, this will cause isotropic etching of an organic layer, leading to significant undercut or bowing. However, if there too little etchant, the etch rate and throughput will suffer. Chemistry can typically be optimized using a controlled flow of an etching species, a passivating species, and a diluting species. One commonly used process for organic layer etching in memory applications includes $O_2$, COS, and $N_2$, which fulfill the roles of etchant, passivant, and diluent, respectively.

The third contribution to bar CD growth and bowing comes from ion bombardment and ion deflection. Due to ion bombardment, the top mask (typically Si-containing layer or layers) is sputtered and redeposited. Since the conventional chemistry is insufficient to remove sputtered Si, this leads to growth of the bar CD. As the bar CD of the top mask grows, an increasing number of ions are deflected towards the sidewalls of the organic layer. The bar CD growth also reduces the space CD in the top mask, limiting the bottom CD. This leads to a bow CD versus bottom CD tradeoff. To obtain a large bottom CD, a compromise in the bow CD is necessary in the prior art.

An embodiment presents a new plasma process to etch an organic layer underneath a Si-containing mask. It overcomes the tradeoffs in the conventional process by introducing a trimming gas to remove the redeposited Si-containing material. Specifically, in this process, a small flow of $CH_3F$ is added. The fluorine species etches away the redeposited Si, preventing unwanted bar CD growth of the Si-containing mask. Due to reduced ion deflection from the top mask, the bow CD in the organic layer is reduced and the profile is more vertical.

The vertical profile generated in organic layer etch is highly desirable and has important implications for the subsequent pattern transfer. As an example, in a prior art process, a large bow CD in the organic layer and large bar CD of the top Si-containing layer can lead to many concerns. During the oxide etch, the mask shape from the top down will change dramatically when there is severe bowing. At first, due to the large bar CD of the top mask, the space pattern is very small. This could lead to potential not open concerns, where some of the trenches or hole are clogged or unformed in the oxide layer. As the top Si mask and the organic mask are slowly consumed, the space CDs enlarge while bar CDs shrink in the organic layer. This could lead to potential defects involving hole bridging, mask fidelity, and non-uniformity. The oxide etch sees a variety of mask profiles during the etch, making the oxide etch process difficult to tune and optimize. Furthermore, due to the bowing and non-vertical/sloped profile, there is considerably more ion deflection from the organic layer sidewalls onto the oxide sidewalls. On the other hand, in various embodiments, all the above concerns are mitigated due to the vertical profile generated in the organic layer. In an embodiment, a sub-20 nm node provides a vertical sidewall profile during via pattern etch. It should be note that the via space CD changes dramatically in the conventional approach, while the changes are reduced in various embodiments. Second, there is line breakage and pattern fidelity problems in the conventional approach. These fidelity issues are not present in various embodiments. Finally, the hole CD uniformity is improved in various embodiments. At the point where there is line breakage in using the conventional process, the hole space CDs are larger and more irregular shaped.

Various embodiments are not limited to a certain mask pattern, or a specific set of materials in the stack. Various embodiments add a trimming gas to remove sputtered and redeposited Si-based material during the plasma etch of an organic layer with an overlying Si-based hard mask pattern. Various embodiments are critical to precisely controlling the CDs and the profile of the organic layer etch.

Embodiments may be used for higher aspect ratio etches, which require a higher ion energy process. Higher ion energy processes increase the sputtering and redeposition from the Si hard mask. Furthermore, a longer process time is required to etch deeper, and as a result, mask sputtering and redeposition, and the bowing will be increased. Additionally, halogen content can be tuned to obtain a compromise between a bowing limited and a mask height limited profile. Therefore, this trimming process provides an orthogonal knob to tune etch performance.

Various embodiments have been found for a sub 20 nm node to reduce bar CD, while increasing throughput by more than 40%. Bowing was reduced by more than 4 nm. The bottom to bow ratio was improved from 75% to 85%. These improvements allow for an increase in device density.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for etching an organic layer below a silicon containing hardmask with hardmask control, the method comprising:
   providing an etch gas comprising:
      oxygen;
      a fluorine containing component; and
      a passivation component,
         wherein a ratio by volume of total flow rate of the etch gas to flow rate of the fluorine containing component is between 10,000:1 to 10:1;
   forming the etch gas into a plasma, wherein the organic layer and the silicon containing hardmask are exposed to the plasma and wherein the plasma selectively etches the organic layer with respect to the silicon containing hardmask; and
   controlling a profile of the silicon containing hardmask during the selective etch of the organic layer, by controlling a flow rate of the fluorine containing component, such that fluorine species in the plasma remove redeposited silicon from sidewalls of the silicon containing hardmask while reducing silicon loss of the silicon containing hardmask during the selective etch, wherein the organic layer is a carbon-based organic layer.

2. The method, as recited in claim 1, wherein the passivation component is halogen free.

3. The method, as recited in claim 1, wherein the selective etch by the plasma includes:
   etching features in the organic carbon based layer and passivating sidewalls of the features;
   sputtering silicon from the silicon containing hardmask, the sputtered silicon being redeposited on the sidewalls of the silicon containing hardmask; and
   trimming the redeposited silicon on the sidewalls of the silicon containing hardmask with the fluorine species.

4. A method for etching an organic carbon based layer below a silicon containing hardmask, comprising:
   providing an etch gas comprising:
      oxygen;
      a fluorine containing component; and
      a passivation component,
         wherein a ratio by volume of total flow rate of the etch gas to flow rate of the fluorine containing component is between 10,000:1 to 10:1;
   forming the etch gas into a plasma, wherein the organic carbon based layer and the silicon contain hardmask are exposed to the plasma and wherein the plasma selectively etches the organic carbon based layer with respect to the silicon containing hardmask; and
   pulsing the fluorine containing component.

5. The method, as recited in claim 1, wherein the silicon containing hardmask is based on at least one of Si, $SiO_2$, SiN, Si-ARC or SiON.

6. The method, as recited in claim 1, wherein the passivation component comprises COS and $CH_4$.

7. The method, as recited in claim 1, wherein the passivation component comprises at least one of COS and $CH_4$.

8. The method, as recited in claim 1, wherein the silicon containing hardmask forms sub 30 nm features.

9. The method, as recited in claim 1, further comprising maintaining a pressure below 40 mTorr while providing the etch gas.

10. The method, as recited in claim 1, wherein the forming the etch gas into a plasma comprises providing RF power to the etch gas.

11. The method, as recited in claim 10, wherein the RF power is pulsed.

12. The method, as recited in claim 1, further comprising using the organic carbon based layer as a mask to etch an etch layer below the organic carbon based layer.

13. The method, as recited in claim 1, wherein a ratio by volume of total flow rate of the etch gas to flow rate of the fluorine containing component is between 300:1 to 20:1.

14. The method, as recited in claim 1, wherein a ratio by volume of total flow rate of the etch gas to flow rate of the fluorine containing component is between 200:1 to 25:1.

15. The method, as recited in claim 1, wherein the organic carbon based layer and the silicon containing hardmask are exposed to the plasma and wherein the plasma selectively etches the organic carbon based layer with respect to the silicon containing hardmask and causes formation of etch features with aspect ratios greater than 3:1.

16. The method, as recited in claim 1, wherein the fluorine containing component is $CH_3F$.

17. The method, as recited in claim 1, wherein the etch gas further comprises at least one of $Cl_2$ or HBr.

18. The method, as recited in claim 1, wherein the organic layer includes amorphous carbon.

19. The method, as recited in claim 1, wherein the fluorine containing component is at least one of $CH_3F$ or $CH_2F_2$.

* * * * *